United States Patent [19]

Mauger et al.

[11] Patent Number: 4,919,749
[45] Date of Patent: Apr. 24, 1990

[54] METHOD FOR MAKING HIGH RESOLUTION SILICON SHADOW MASKS

[75] Inventors: Philip E. Mauger, Santa Clara; Alex R. Shimkunas, Palo Alto; Junling J. Yen, Cupertino, all of Calif.

[73] Assignee: Nanostructures, Inc., Mountain View, Calif.

[21] Appl. No.: 357,481

[22] Filed: May 26, 1989

[51] Int. Cl.$^5$ .................. H01L 21/306; B44C 1/22; C03C 15/00; C03C 25/06

[52] U.S. Cl. ................... 156/643; 156/644; 156/646; 156/651; 156/653; 156/657; 156/659.1; 156/662; 204/192.3; 204/192.37; 252/79.1; 313/402

[58] Field of Search ............... 156/643, 644, 646, 651, 156/653, 657, 659.1, 662; 204/192.3, 192.32, 192.37; 313/402, 403, 408; 252/79.1

[56] References Cited

U.S. PATENT DOCUMENTS

| | | | |
|---|---|---|---|
| 3,713,922 | 1/1973 | Lepselter et al. | 156/644 X |
| 4,256,532 | 3/1981 | Magdo et al. | 156/628 |
| 4,417,946 | 11/1983 | Bohlen et al. | 156/643 |
| 4,448,865 | 5/1984 | Bohlen et al. | 430/5 |
| 4,589,952 | 5/1986 | Behringer et al. | 156/628 |

OTHER PUBLICATIONS

Randall et al., "The Thermomechanical Stability of Ion Beam Masking", J. Vac. Sci. Technol., B5(1), Jan./Feb. 1987, pp. 223–227.
Shioya et al., "Comparison of Phosphosilicate Glass Films Deposited by Three Different Chemical Vapor Deposition Methods", J. Electrochemical Society, 133(9), Sep. 1986, pp. 1943–1950.
Yin et al., "Etch Silicon Dioxide with High Selectivity and Low Polymer Formation", Semiconductor International, Sep. 1988, pp. 110–114.
Fong et al., "High-Resolution Fabrication Process for Silicon Ion Masks", J. Vac. Sci. Technol., B6(6), Nov./Dec. 1988, 2112–2114.
Ameer et al., "Silicon Trench Etching Made Easy", Semiconductor International, Sep. 1988, pp. 122–128.

Primary Examiner—William A. Powell
Attorney, Agent, or Firm—Blakely, Sokoloff, Taylor and Zafman

[57] ABSTRACT

A high resolution shadow mask with low pattern distortion is formed from a silicon membrane with a pattern of apertures etched through the membrane by reactive ion etching using a silicon dioxide masking layer. To achieve low distortion over a large area membrane, the stress of the membrane and the masking layer is controlled to remain within an optimal range so that the stress relief that occurs when the apertures are formed is kept negligibly small. A silicon membrane with controlled stress is made using a p/n junction electrochemical etch-stop process. After making the membrane, it is then coated with a deposited silicon dioxide layer. The stress of the oxide layer may be adjusted to an optimum value by annealing after deposition. The membrane with the oxide mask layer is next coated with a photoresist layer which is then patterned with the desired shadow mask pattern. Once the photoresist is patterned, the pattern is then transferred into the oxide layer by reactive ion etching. The patterned oxide then serves as the mask for etching apertures through the silicon membrane, also done by reactive ion etching.

28 Claims, 2 Drawing Sheets

METHOD FOR MAKING HIGH RESOLUTION SILICON SHADOW MASKS

BACKGROUND OF THE INVENTION

1. Field of the Invention

This invention relates to the fabrication of high resolution shadow masks for electron, ion beam and X-ray lithography, ion implantation, and ion etching.

2. Background Art

Charged particle beams (electron or ion) are widely used in the fabrication of semiconductor devices. In order to achieve the high resolution required for lithographic applications, the beams are focused down to a small spot which is then scanned across the substrate. Due to the small spot sizes, the scanning time can be quite long when large areas need to be covered. One alternative to focused beam scanning is to use broad area beams with the pattern definition provided by shadow masks. A shadow mask consists of a thin substrate (typically a membrane) which has been patterned with holes that allow passage of the ions or electrons through the mask. This approach allows for the simultaneous processing of many pattern elements over a wide area and consequently greatly improves the speed of the lithographic process.

Shadow masks may be used either in a proximity mode or in a projection type system. In a proximity process the mask is placed in very close proximity to the wafer to be patterned. The pattern transfer to the wafer occurs by simple shadowing and the mask pattern is reproduced on the wafer at a 1-to-1 size ratio. In a projection system, the mask is positioned in a lens system such that the pattern of ions or electrons leaving the mask can be focused onto the wafer even though the mask and wafer are not physically in close contact. A projection system may be 1-to-1 or it may operate with a magnification factor.

Shadow masks are also potentially useful for ion implantation or etching. In these processes as generally practiced, masking layers are applied to a surface of each wafer individually. The masking layers are then patterned using standard lithographic techniques. Each wafer is exposed to the ion beam with the pattern definition provided by the masking layer. After completing the implantation or etching process, the mask layers must then be removed. The use of shadow masks to provide the pattern definition would eliminate the need to apply and pattern masking layers on each wafer and would thereby significantly reduce the amount of processing required.

The use of silicon shadow masks for ion implantation has been disclosed by Lepselter et al. in U.S. Pat. No. 3,713,922. The masks described by Lepselter consist of thin membranes of silicon supported by a grid of thicker reinforcing ribs. The membranes are of n-type material and are formed by a preferential etch-stop technique using n+ doped support wafers. The use of a reinforcing grid is a severe limitation since it restricts the die sizes that can be patterned. Lepselter suggests die sizes from 50 to 500 microns using this technique. Currently, very large scale integrated (VLSI) circuit designs call for die sizes having lateral dimensions of up to 12 to 15 mm. Future developments in VLSI technology are anticipated to require even larger die sizes. In order to be practically useful for such large die sizes, shadow masks should have self-supporting membranes of at least several centimeters in lateral dimension.

Alternative shadow mask techniques are disclosed by Magdo et al. in U.S. Pat. No. 4,256,532; by Bohlen et al. in U.S. Pat. Nos. 4,417,946 and 4,448,865; and by Behringer in U.S. Pat. No. 4,589,952. The basic membrane fabrication technique used in all of these inventions is to produce a highly doped p+ membrane by preferentially etching a lightly doped substrate.

The methods of Lepselter, Bohlen, and Behringer all define the circuit pattern on the shadow mask prior to forming the membrane. To do this, the silicon layer that will ultimately form the membrane is first patterned while the support wafer is still intact. The support wafer is subsequently etched away in the region that will be the membrane. Magdo uses the reverse sequence in that the membrane is formed first by etching away the underlying substrate and then the membrane is patterned to produce the shadow mask.

In order to produce a shadow mask that is useful for semiconductor manufacturing, several requirements must be met. Typical pattern elements in VLSI designs are now below 1 micron in size and future developments anticipate features as small as 0.25 microns. Therefore, any shadow masking technique must be capable of producing masks with openings in this size range. As discussed above, die sizes require that the self-supporting mask area must be at least several centimeters in size. An additional requirement that is particularly important for shadow masks is that pattern distortion must be kept below certain limits. Since typical integrated circuit designs have multiple patterning layers, in order for the final device to function properly the pattern of each layer must be in precise registration with all other layers. Typical requirements are that pattern distortion must be maintained at one tenth of the minimum feature size over the area of the die. For the die sizes and feature sizes discussed above, this requirement translates into the restriction that pattern placement of features on the mask must be accurate to within a few parts per million over the mask area, or to within tolerances as small as 100 nm.

The requirement of low pattern distortion places an important restriction on the value of internal stress allowed in the membrane. This subject is considered in detail by Randall et al., "The Thermomechanical Stability of Ion Beam Masking", Journal of Vacuum Science Technology, B5(1), Jan./Feb. 1987, pp. 223–227. The general conclusion of this work is that to achieve acceptable distortion levels the tensile stress of the silicon membrane must be controlled to be lower than $3 \times 10^8$ dynes/cm$^2$. This same consideration carries over to any additional layers that are applied to the silicon membrane.

A countervailing consideration is that the membrane must have enough tensile stress so that it remains flat. Flatness is required to insure that high resolution images can be formed on a circuit die using the membrane as a mask. The prior art for the fabrication of large area silicon shadow masks discussed above fails to deal with this problem adequately. Unless additional stress compensation techniques are applied, membranes made of p+ material on lightly doped substates will have stress levels several times higher than the range shown by Randall to be required. The stresses of the various masking layers employed is also not controlled in these processes. Therefore, one of the objects of this invention is to provide a process for the fabrication of silicon shadow masks which can maintain stress levels within the relatively limited range required so that low distortion masks can be produced.

SUMMARY OF THE INVENTION

This invention provides a technique for the fabrication of high resolution shadow masks with low pattern distortion. The mask consists of a silicon membrane with a pattern of apertures etched through the membrane by reactive ion etching using a silicon dioxide masking layer. To achieve low distortion over large area membranes, the stress of the membrane and the masking layer is controlled to remain within an optimal range so that the stress relief that occurs when the openings are formed is kept negligibly small.

The mask fabrication process is performed using a membrane with a controlled stress level. Silicon membranes can be made with controlled stress using a p/n junction electochemical etch-stop process. This latter process is the subject of commonly assigned co-pending patent application Ser. No. 07/243,816, filed 09/13/88. After making the membrane, it is then coated with a silicon dioxide layer. The silicon dioxide serves as the mask layer for etching the openings through the silicon membrane. The oxide layer must be deposited on the membrane rather than thermally grown. Techniques for the deposition of oxide layers include chemical vapor deposition from the decomposition of silane, thermal evaporation and sputtering. The stress of the oxide layer may be adjusted to an optimum value by annealing after deposition.

The membrane with the oxide mask layer is next coated with a photoresist layer which is then patterned with the desired shadow mask pattern. Once the photoresist is patterned, the pattern is then transferred into the oxide layer by reactive ion etching. The patterned oxide then serves as the mask for etching openings into the silicon, also done by reactive ion etching. During these two patterning steps, stress relief will occur due to the removal of material in the areas to be opened.

After the silicon is etched, any remaining oxide is removed. Further stress relief will occur at this point. The magnitude of the stress relief will depend on the size of the membrane, the specific details of the pattern, and the stress levels of the silicon and silicon dioxide layers. However, stress levels are controlled so that patterns with high resolution can be successfully made over areas large enough to be useful for VLSI semiconductor device fabrication.

DETAILED DESCRIPTION OF THE INVENTION

In the following description, for purposes of explanation and not limitation, specific numbers, dimensions, materials, etc. are set forth in order to provide a thorough understanding of the present invention. However, it will be apparent to one skilled in the art that the present invention may be practiced in other embodiments that depart from these specific details. In other instances, well known techniques for processing semiconductor materials are referred to without elaboration so as not to obscure the disclosure of the present invention with unnecessary detail.

Figure 8:
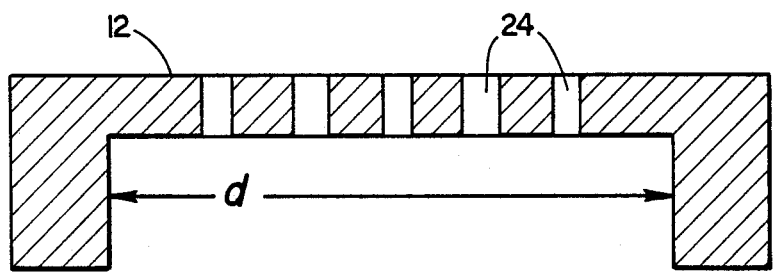
FIG. 8 is a schematic cross-sectional view of the completed shadow mask.

Referring briefly to FIG. 8, a schematic cross section of a completed silicon shadow mask formed according to the method of this invention is shown. It should be noted that FIG. 8, as well as all other figures, is merely schematic in nature, and thus the features of the mask are not shown to scale. In particular, relative dimensions are highly distorted in many instances for the sake of overall clarity of presentation. The mask depicted in FIG. 8 consists of a silicon wafer 10 that has been etched out from the bottom to form a membrane 12 of diameter d. The openings 24 in the membrane 12 allow for passage of electrons or ions through the mask and define the pattern to be produced.

Figure 1:
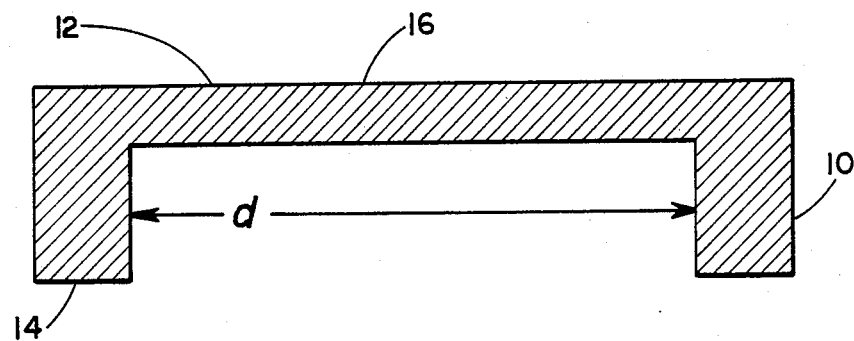
FIG. 1 is a schematic cross-sectional view of a silicon membrane used to form a shadow mask according to the present invention.

The process for producing the shadow mask of FIG. 8 begins with the formation of a silicon membrane. A cross section of a "blank" membrane is shown in FIG. 1. A silicon wafer 10 has been thinned down to form the membrane 12 of diameter d. As discussed above, in order to be useful for VLSI lithographic applications, the diameter d of the membrane 12 must be at least of the order of 2 cm or larger. As also discussed above, the stress of the membrane must be controlled to be in the range of approximately 0.5 to $3.0 \times 10^8$ dynes/cm$^2$ tensile to minimize pattern distortion. A process for producing membranes with these characteristics is the subject of commonly assigned co-pending patent application Ser. No. 07/243,816, filed 09/13/88 the disclosure of which is incorporated herein by reference. Using such process, large area silicon membranes with controlled stress are produced by using a p/n junction electrochemical etch-stop technique.

Membranes are made using standard commercially available silicon wafers as the starting material. Such wafers are typically available in diameters of approximately 3, 4, 5 and 6 inches. The size of the wafer used is selected to accommodate the membrane configuration desired for a particular application. The maximum membrane size that can be readily made on a given wafer is about 1 inch smaller than the wafer diameter to allow for a rim 14 of unetched material as shown in FIG. 1. This rim is used to provide mechanical rigidity to the structure and allow for handling. As an alternative to the single large membrane shown in FIG. 1, multiple smaller membranes can be made. The thickness of membranes made using the above-referenced technique can be varied from less than one micron to up to 25 microns depending on the size of the membrane. Two inch diameter membranes have been made with thicknesses of as little as 0.75 microns. For larger area membranes minimum thicknesses are greater. For a 4 inch diameter membrane, a thickness of about 2 microns is needed.

Figure 2:
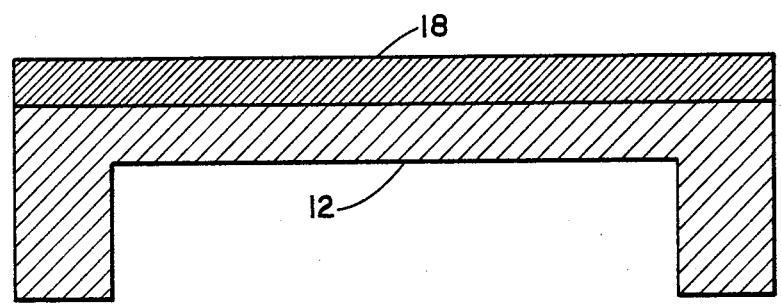
FIGS. 2-7 illustrate the processing steps of the present invention.

After fabrication of the membrane 12, the upper surface 16 is coated with a silicon dioxide layer 18 as shown in FIG. 2. It is important that oxide layer 18 be deposited onto the membrane surface rather than grown thermally. Thermal oxides are typically grown on silicon wafers by exposing the wafer to an oxygen or steam atmosphere at 900° to 1100° C. Oxide layers formed by this technique have compressive internal stress levels of over $1 \times 10^9$ dynes/cm$^2$ when cooled to room temperature due to the mismatch in thermal expansion between the oxide and the silicon. Such a high compressive stress level in the oxide layer will cause the membrane to wrinkle or distort even for very thin oxide layers.

The alternative to using thermally grown oxide layers is to use a deposited layer of silicon dioxide. Well known techniques for depositing oxide layers are chemical vapor deposition, evaporation and sputtering. With these techniques, oxide layers up to about 1.5 microns in thickness can be deposited. The thickness of the oxide layer required depends on the thickness of the underlying silicon membrane to be reactive ion etched through and the erosion rate of the oxide mask during this process. As discussed subsequently, for typical process conditions used for the silicon reactive ion etch process, oxide thicknesses from 0.25 to 0.75 microns may normally be used for membrane thicknesses of 2 to 5 microns.

The principal advantage in the use of deposited oxide layers over thermal oxide layers is that the stress levels of the deposited layers can be adjusted by thermal annealing to be in the range required to produce low distortion masks. Thermal annealing of deposited films is discussed by Y. Shioya, et al., "Comparison of Phosphosilicate Glass Films Deposited by Three Different Chemical Vapor Deposition Methods", Journal of the Electrochemical Society, 133(9), Sept. 1986, pp. 1943-1950. After deposition, the film stress is compressive. Upon annealing in a nitrogen atmosphere, the stress in the film changes from the initial compressive value to a maximum tensile value at annealing temperatures in the range of 500°-600° C. Annealing at higher temperatures causes the stress to become compressive again. By appropriate choice of the annealing temperature, the stress of the oxide layer can be selected to minimize mask pattern distortion. A small tensile value of less than $1 \times 10^8$ dynes/cm$^2$ is considered optimal for most applications.

Figure 3:
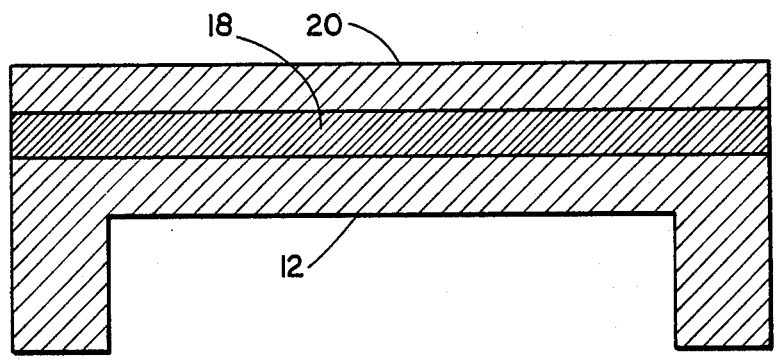
Figure 4:
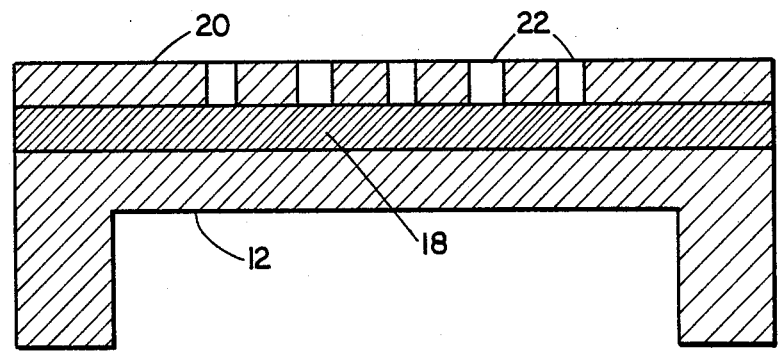
Figure 5:
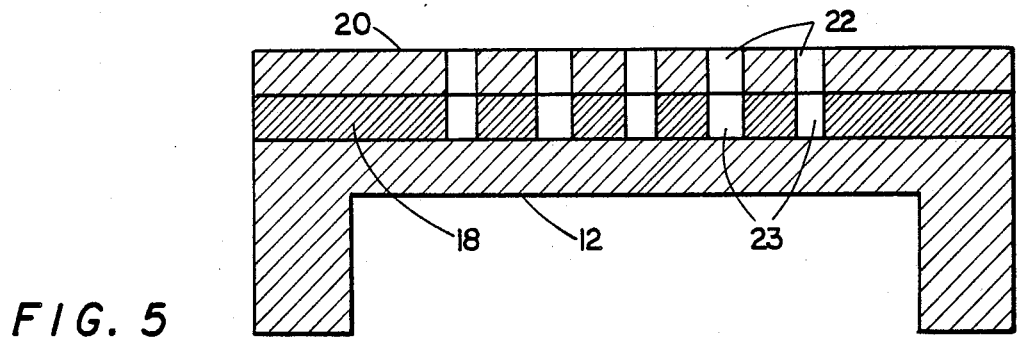
Figure 6:
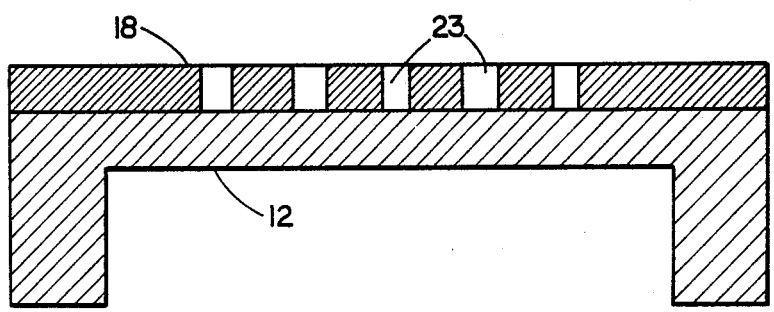

After deposition and annealing of the oxide layer, a layer of photoresist 20 is applied as shown in FIG. 3. The photoresist is then exposed and developed using conventional techniques to form the pattern openings 22 as shown in FIG. 4. The resist pattern is used as a mask for reactive ion etching of the oxide layer 18 to etch openings 23 as illustrated in FIG. 5. Typical processes used for oxide etching are disclosed by G. Z. Yin, et al., "Etch Silicon Dioxide with High Selectivity and Low Polymer Formation", Semiconductor International, Sept. 1988, pp. 110-114. The erosion rate of the resist layer during this process is less than 10% of the etch rate of the oxide layer for this process. Therefore, for oxide layers of less than 1 micron thickness, less than 0.1 micron of resist will be lost. Initial resist thicknesses in the range 0.3 to 0.5 microns are adequate to provide masking for the oxide etch without any loss of pattern definition. After completion of the oxide etching, the resist remaining on the mask is removed by stripping in an oxygen plasma as is conventionally done with silicon wafers, thereby yielding the structure shown in FIG. 6.

Figure 7:
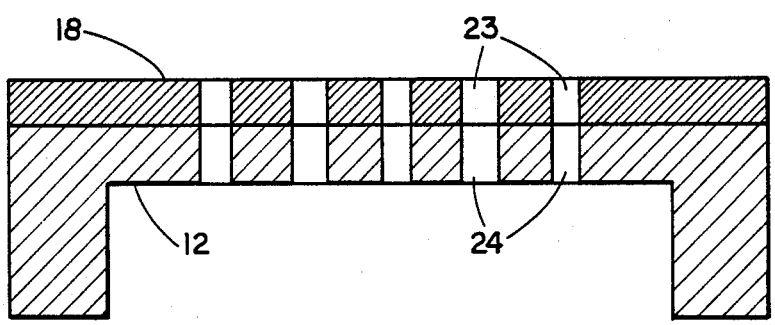

The patterned oxide layer now serves as a mask for the reactive ion etching of the silicon membrane as shown in FIG. 7. Two alternative processes exist for this step. In one case, the etching of the silicon is accomplished through the use of reactive gas plasmas based on bromine chemistries, or alternatively chlorine based chemistry can be used. In the case of bromine, the plasma can be obtained either from vapor derived from liquid bromine solutions or from a hydrogen bromide gas source. Descriptions of silicon etching using bromine are given by F-O. Fong, et al., "High-Resolution Fabrication Process for Silicon Ion Masks", Journal of Vacuum Science Technology, B6(6), Nov./Dec. 1988, pp. 2112-2114. In the case of chlorine etching, gas sources such as CCl$_4$ or Cl$_2$ are used as described by M. Ameer, et al., "Silicon Trench Etching Made Easy", Semiconductor International, Sept. 1988, pp. 122-128.

The silicon of membrane 12 is etched completely through using the patterned oxide layer 18 as a mask to form openings 24 in membrane 12 that allow for the passage of a charged particle beam. The remaining oxide layer 18 can then be removed either through additional reactive ion etching or by etching it off chemically in a hydrofluoric acid solution. The end result gives a completed silicon shadow mask as shown in FIG. 8.

Figure 9:
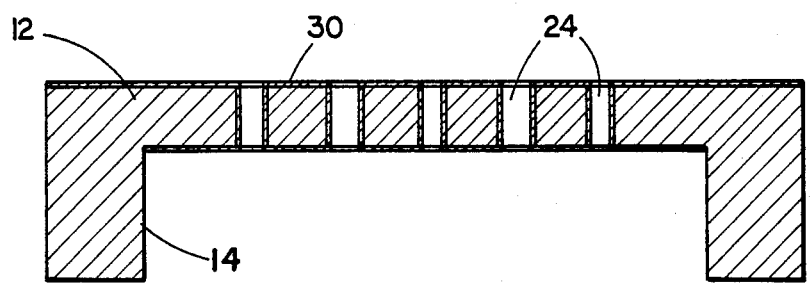
FIG. 9 illustrates an additional process step to metallize the shadow mask of FIG. 8.

An alternative embodiment of a completed shadow mask is shown in FIG. 9. In this case, an additional process step is performed to coat the silicon mask with a thin metal layer 30 to provide for charge neutralization. During exposure with a charged particle beam, the metal layer 30 neutralizes the electrical charge of the particles that strike the mask surface surrounding openings 24.

It will be recognized that the above described invention may be embodied in other specific forms without departing from the spirit or essential characteristics of this disclosure. Thus, it is understood that the invention is not to be limited by the foregoing illustrative details, but rather is to be defined by the appended claims.

We claim:

1. A method of forming a silicon shadow mask having a pattern of etched through apertures comprising the steps of:
   (a) forming a silicon membrane having a selectively controlled predetermined stress characteristic and a thickness of less than approximately 25 microns;
   (b) applying a masking layer to an upper surface of said silicon membrane;
   (c) patterning said masking layer with a pattern corresponding to said pattern of etched through apertures;
   (d) etching away said masking layer in regions corresponding to said pattern of etched through apertures;
   (e) etching away said silicon membrane in said regions corresponding to said pattern of etched through apertures, thereby creating said etched through apertures;
   (f) removing remaining portions of said masking layer.

2. The method of claim 1 wherein said masking layer is SiO$_2$.

3. The method of claim 2 wherein said SiO$_2$ masking layer is formed by chemical vapor deposition.

4. The method of claim 2 wherein said SiO$_2$ masking layer is deposited by evaporation.

5. The method of claim 2 wherein said SiO$_2$ masking layer is deposited by sputtering.

6. The method of claim 2 further comprising the step of thermal annealing said SiO$_2$ masking layer.

7. The method of claim 6 wherein said SiO$_2$ masking layer is thermally annealed to achieve an internal tensile stress value of less than approximately $1 \times 10^8$ dynes/cm$^2$.

8. The method of claim 2 wherein said $SiO_2$ masking layer is etched away with a reactive ion etching process.

9. The method of claim 1 wherein said selectively controlled predetermined stress characteristic is an internal tensile stress value in the range of 0.5 to $3.0 \times 10^8$ dynes/cm$^2$.

10. The method of claim 1 wherein said masking layer is patterned with a photoresist layer.

11. The method of claim 10 further comprising the step, after the step of etching away said masking layer, of removing said photoresist layer in an oxygen plasma.

12. The method of claim 1 wherein said silicon membrane is etched away with a reactive ion etching process.

13. The method of claim 12 wherein said reactive ion etching process employs a bromine plasma.

14. The method of claim 13 wherein said bromine plasma is derived from a liquid bromine solution.

15. The method of claim 13 wherein said bromine plasma is derived from hydrogen bromide gas.

16. The method of claim 12 wherein said reactive ion etching process employs a chlorine plasma.

17. The method of claim 1 further comprising the step of metallizing said silicon membrane in regions surrounding said etched through apertures.

18. A method of forming a silicon shadow mask having a pattern of through apertures comprising the steps of:
(a) forming a silicon membrane having internal tensile stress in the range of approximately 0.5 to $3.0 \times 10^8$ dynes/cm$^2$;
(b) applying a $SiO_2$ masking layer to an upper surface of said silicon membrane:
(c) thermal annealing said $SiO_2$ masking layer to achieve an internal tensile stress of less than approximately $1 \times 10^8$ dynes/cm$^2$;
(d) removing said $SiO_2$ masking layer in regions corresponding to said pattern of through apertures;
(e) removing said silicon membrane in said regions corresponding to said pattern of through apertures, thereby creating said through apertures;
(f) removing remaining portions of said $SiO_2$ masking layer.

19. The method of claim 18 wherein said $SiO_2$ masking layer is formed by chemical vapor deposition.

20. The method of claim 18 wherein said $SiO_2$ masking layer is deposited by evaporation.

21. The method of claim 18 wherein said $SiO_2$ masking layer is deposited by sputtering.

22. The method of claim 18 wherein said $SiO_2$ masking layer is removed with a reactive ion etching process.

23. The method of claim 18 wherein said silicon membrane is removed with a reactive ion etching process.

24. The method of claim 23 wherein said reactive ion etching process employs a bromine plasma.

25. The method of claim 24 wherein said bromine plasma is derived from a liquid bromine solution.

26. The method of claim 24 wherein said bromine plasma is derived from hydrogen bromide gas.

27. The method of claim 23 wherein said reactive ion etching process employs a chlorine plasma.

28. The method of claim 18 further comprising the step of metallizing said silicon membrane in regions surrounding said through apertures.

* * * * *

UNITED STATES PATENT AND TRADEMARK OFFICE
CERTIFICATE OF CORRECTION

PATENT NO.   : 4,919,749

DATED        : 4/24/90

INVENTOR(S)  : Mauger et al.

It is certified that error in the above-identified patent and that said Letters Patent is hereby corrected as shown below:

| | | |
|---|---|---|
| col. 02, line 15 | delete "wafter" | insert --wafer-- |
| col. 02, line 63 | delete "substates" | insert --substrates-- |
| col. 03, line 19 | delete "electochemical" | insert --electrochemical-- |

Signed and Sealed this

Twenty-second Day of October, 1991

Attest:

HARRY F. MANBECK, JR.

*Attesting Officer*    *Commissioner of Patents and Trademarks*